United States Patent [19]

Hallock et al.

[11] Patent Number: 5,925,719

[45] Date of Patent: Jul. 20, 1999

[54] PHOTORESIST DEVELOPABLE IN AQUEOUS BASE MADE FROM ACID-FUNCTIONAL β-HYDROXY THIOL RESIN

[75] Inventors: John S. Hallock, Ellicott City, Md.; Donald E. Herr, Flemington, N.J.

[73] Assignee: MacDermid, Incorporated, Waterbury, Conn.

[21] Appl. No.: 08/879,089

[22] Filed: Jun. 19, 1997

[51] Int. Cl.[6] ............................. C08G 59/16; C08K 3/20; C08L 63/02; C08L 63/04

[52] U.S. Cl. ........................ 525/505; 522/53; 522/169; 522/170; 525/481; 525/502; 525/524; 525/527; 525/529; 525/533; 528/109; 523/404; 523/414

[58] Field of Search .................................... 525/505, 533, 525/481, 502, 524, 527, 529; 528/109; 522/53, 169, 170; 523/404, 414

[56] References Cited

U.S. PATENT DOCUMENTS

| | | | |
|---|---|---|---|
| 2,943,095 | 4/1960 | Farnham et al. . | |
| 2,943,096 | 4/1960 | Reinking . | |
| 3,258,495 | 6/1966 | Le Fave et al. . | |
| 3,904,499 | 9/1975 | Morgan | 204/159.15 |
| 4,006,270 | 2/1977 | Morgan | 427/43 |
| 4,020,233 | 4/1977 | Morgan | 428/419 |
| 4,135,047 | 1/1979 | Morgan | 544/219 |
| 4,591,522 | 5/1986 | Kang | 522/107 |
| 5,019,483 | 5/1991 | Lin et al. | 430/288 |

FOREIGN PATENT DOCUMENTS

| | | |
|---|---|---|
| 0213 701 | 5/1985 | European Pat. Off. . |
| 60-144321 | 7/1985 | Japan . |
| 62-96524 | 5/1987 | Japan . |
| 5-346666 | 12/1993 | Japan . |
| 2012 781 | 3/1978 | United Kingdom . |

OTHER PUBLICATIONS

Epoxy Resins—Their Applications and Technology, H. Lee and K. Neville, ed., McGraw-Hill Book Co., Inc., New York, NY, pp. 21–22. (1957).

*Primary Examiner*—Robert E. Sellers
*Attorney, Agent, or Firm*—John L. Cordani

[57] ABSTRACT

A substantially ester-free, acid-functional thiol-functional resin is prepared via the reaction of an epoxy compound with a thiolacetic acid in the presence of an amine catalyst and heat to form a thioacetate derivative which is hydrolyzed to yield an ester-free, β-hydroxy thiol-functional resin. The β-hydroxy thiol-functional resin can then be reacted with a material capable of insert a group conferring aqueous-base developability such as a cyclic anhydride.

8 Claims, No Drawings

5,925,719

PHOTORESIST DEVELOPABLE IN AQUEOUS BASE MADE FROM ACID-FUNCTIONAL β-HYDROXY THIOL RESIN

FIELD OF THE INVENTION

The present invention relates generally to the field of photoimageable, aqueous base developable compositions, particularly acid functional, substantially ester-free multifunctional thiol resins having novolak, cyanurate, or isocyanurate backbones that are generally useful in combination with unsaturated resins as photoresists and solder masks.

BACKGROUND OF THE INVENTION

Curable coating compositions have wide application in number of fields, as they are useful for protecting various kinds of surfaces from severe chemical and physical environments. A solder mask, for example, is a permanent coating for a printed circuit board that must not cover certain parts of the circuitry on the board such as the contact points. A photoimageable, UV-curable solder mask is applied as a coating to the entire board, and then exposed to ultraviolet light through a pattern, or image. Where the light falls on the coating, the coating hardens, or cures. The portions that are not exposed to the light remain unhardened and are washed away in a developer solution. Sometimes it is desirable to further treat the solder mask to toughen it. In that case, the coating might be baked in order to crosslink it and further improve its chemical, heat, and moisture resistance.

Materials which are useful in the above-described processes are well known, and are available as formulations that are developable in solvents made of volatile organic compounds (VOCs). VOCs, however, have been identified as pollutants and have been targeted by a variety of regulations aimed at reducing their use. Accordingly, efforts have been directed toward obtaining photoimageable coating materials that are water-developable.

One technique for rendering a photoimageable coating material water developable is to add acidic functional groups to an organic molecule that is otherwise known to yield good physical properties when formulated as a coating. For example, certain commercially available formulations use polymers modified to incorporate significant amounts of carboxylic acid functional groups in order to confer water dispersibility on an otherwise hydrophobic molecule. Such coatings are typically developable in alkaline water (for example, 1% carbonate) solutions. Of these, systems utilizing acrylates and epoxies predominate.

Acrylate/epoxy systems are well-known. The photoinitiated radical chain crosslinking reactions of acrylates represent the most common type of mechanism utilized in UV curable coatings. There are, however, inherent weaknesses in these systems. The radical chain reaction is inhibited by atmospheric oxygen, a problem that can be minimized through a combination of approaches such as using high intensity UV sources, higher levels of photoinitiators or synergists than would otherwise be required, or photocuring in vacuo or under inert atmospheres. In spite of these measures, there is usually an "incubation period" during which oxygen and photoinitiator are being consumed without significant crosslinking taking place. In solder masks, all three of these approaches are frequently applied in an effort to reduce the necessary exposure times and provide a better surface cure. However, these efforts tend to have a negative impact on other performance features, such as sidewall profiles, thereby limiting image resolution. Additionally, acrylate based systems by definition have high levels of ester linkages, which can become hydrolytically weak links in demanding applications like the solder mask, where extremes of pH and temperature are encountered not only in process (such as plating baths) but sometimes in the finished product. Acrylate systems occassionally exhibit insufficient adhesion. Adhesion promoters can be used, but these may interfere with other desirable properties of the coating. Finally, acrylate crosslinked coatings can suffer from brittleness due to shrinkage that occurs during photocuring, however this effect can be moderated by utilizing a thermal epoxy cure.

Curable systems that utilize the reaction of thiols with unsaturated hydrocarbons are also known. U.S. Pat. No. 4,020,233, issued to Morgan Apr. 26, 1977 relates to heat-activated compositions comprising ethylenically unsaturated compounds in combination with polythiols and pinacol catalysts. U.S. Pat. No. 4,006,270 issued to Morgan Feb. 1, 1977 relates to novel solid polyfunctional unsaturated compounds derived from styrene-allyl alcohol copolymers reacted with polythiols for use in imaging applications. U.S. Pat. No. 3,904,499 issued to Morgan teaches the use of solid polythiols based on styrene-allyl alcohol copolymers with liquid polyfunctional unsaturated compounds. All of the above references teach the use of thiols which will yield ester-containing cross-links upon curing, and all use organic solvents in the development process.

Other reactions utilizing thiols and unsaturated compounds are known. U.S. Pat. No. 4,135,047 issued to Morgan Jan. 16, 1979 relates of the preparation of thioethers using a benzopinacol initiator. Acid-containing thiols are mentioned as potential raw materials. No specific use of the resulting material is disclosed, and there is no discussion of photoimaging, much less water development.

Thiols which are ester-free are known. See U.S. Pat. No. 4,591,522 issued to Kang, et al. May 27, 1986, which relates to liquid photopolymer formulations made with the reaction product of a non-ester containing polythiol with an unsaturated chlorendate to yield a fire-retardant, hydrolysis resistant final product. Neither photoimaging, nor waterdevelopable formulations are disclosed.

Acid functionalized polythiols have been used in photoresists as adhesion promoters. See U.S. Pat. No. 5,091,483 issued to Lin et al. May 28, 1991. In this case, the polythiol is used as an additive at very low, non-stoichiometric amounts, in an attempt to avoid scumming in an acrylate curing system. No mention is made of thiol-ene photoimaging systems.

SUMMARY OF THE INVENTION

It is an object of the present invention to provide a thiol-ene curing photoimageable composition that is developable in aqueous base. A further object of this invention is to provide a photoimageable composition having improved hydrolytic stability. It is yet a further object of this invention to provide a contact-imageable solder mask.

The present inventors have found that acid functional, ester-free multifunctional thiol resins having novolak, cyanurate, isocyanurate, or bisphenol A backbones are generally useful in combination with unsaturated resins as aqueous-base developable photoresists and solder masks. An advantage of the present invention is that the system exhibits greatly reduuced, or no, sensitivity to oxygen. A further advantage is that the system has high thiol functionality in addition to the requisite acid functionality, and therefore has good photospeed. Yet another advantage is that the system may exhibit improved adhesion to the substrates commonly used in the making of printed circuit boards, thereby reducing or eliminating the need for adhesion promoters.

These and other objects and advantages of the present invention will become apparent through the text and examples herein.

DETAILED DESCRIPTION OF THE INVENTION

Thiols

The thiols of the present invention are preferably acid functional, substantially ester-free multifunctional thiol resins having backbones with substantial aromatic character. In one embodiment of the invention, thiol resins can be made by reacting epoxy compounds with thiolacetic acid in the presence of an amine catalyst and heat, to form the thioacetate derivative, which can be readily hydrolyzed to yield an ester-free, β-hydroxy thiol. The β-hydroxy thiol can then be reacted with a material capable of inserting a group conferring aqueous-base developability, preferably a cyclic anhydride such as maleic, succinic, trimellitic, phthalic, tetrahydrophthalic, or hexahydrophthalic anhydride, or mixtures thereof. This reaction is believed to initially form a thioester-bound carboxylic acid group, which then rearranges to the β-hydroxy group, to regenerate the thiol group and form a pendant carboxylic acid group. The net effect is that new acid groups are introduced using thiol participation without destroying the thiol functionality. This embodiment has an advantage in that it preserves the highest possible thiol functionality, a feature that could be very important for photosensitivity, photospeed, and final crosslinked film properties. This embodiment also introduces an ester linkage, which is potentially hydrolytically sensitive; however, this linkage is pendant and, unlike acrylate systems, will not be a part of the crosslinked network formed between the thiol group and an unsaturated group. As a result, this embodiment produces an acid-functional β-hydroxy thiol which is substantially ester-free because it has ester-free crosslinking.

In an alternative embodiment, the chlorohydrin analog of the epoxy resins can serve as suitable starting materials. The chlorohydrin-functional resin can be obtained by the hydrochlorination of an epoxy resin to yield a β-hydroxy group-containing chlorohydrin-functional resin.

In principle, the epoxy resins which form the backbone of the acid-functional thiol can be any epoxy compound that has one or more epoxy groups and eventually yields the desired coating properties. These include epoxy resins represented by derivatives of bisphenol A, cyanurates, isocyanurates, linear aliphatic resins, alicyclic resins, and Novolak resins. As a practical matter, epoxy resins with two or more epoxy groups and substantial aromatic character are preferred. These include epoxy resins derived from phenol and cresol Novolak resins, as well as cyanurate and isocyanurate resins. Commercially available examples include Epon 164, an epoxy cresol novolak resin available from Shell Chemical Co., Houston, Tex., Epon 825, bisphenol A diglycidyl ether available from Shell Chemical Co., and TEPIC-s, a tris(2,3epoxypropyl)isocyanurate resin available from Nissan Chemical Industries, Ltd.

Unsaturated resin

In the present invention, the thiol will react, or crosslink, with a polymerizable unsaturated resin. Polymerizable unsaturated resins, that is, resins which contain one or more reactive carbon-carbon double or triple bonds, are sometimes called "ene" resins, and the crosslinking reaction may be referred to as a "thiol-ene" reaction. The unsaturated resin preferably has at least two unsaturated sites, and is substantially ester-free in the same sense the thiol resin is substantially ester-free. That is, the resin is preferred to be wholly ester free, but at least must not have hydrolytically unstable ester groups located within the portions of the molecule that will eventualy be involved in crosslinking. The choice of ene resin is influenced by the choice of thiol resin, and vice versa. For example, where it is desired that the uncrosslinked mixture of the thiol-ene system be a liquid, either or both resins may be low molecular weight liquids. Where the uncrosslinked formulation is desired in the form of a tack-free solid upon drying, however, it is usually preferred that one or both of the resins be of a higher molecular weight solid and have substantial aromatic character. These include unsaturated phenol and cresol Novolak resins, as well as unsaturated cyanurate and isocyanurate resins such as triallyl cyanurate, triallyl isocyanurate and 4,4'bis(allyloxy)benzophenone.

Another class of ene resins useful in the present invention are the ester-free unsaturated resins, such as those described in U.S. Pat. No. 4,006,270 issued to Morgan Feb. 1, 1977 and U.S. Pat. No. 3,904,499 issued to Morgan Sep. 9, 1975.

Other Formulation Materials

The thiol-ene formulation may include other additives typical for the desired end use, including photosensitizers, photoinitiators, inhibitors, pigments, dyes, fillers, such as alumina and fumed silica, and rheology aids. The formulation may contain unsaturated and/or acid-containing oligomers as needed to modify the ultimate physical properties of the end product. Where a thermal cure is desired, the formulation may further contain one or more epoxy resins.

The following Examples are presented for the purpose of illustrating the practice of the present invention. They do not limit the invention, or the claims which follow.

EXAMPLES

Example 1

Preparation of Difunctional β-hydroxy Thiol Resin from Bisphenol A Diglycidyl Ether To 20.0 g of bisphenol A diglycidyl ether (EPON® 825 from Shell Chemical Co.) were added 9.57 g (a 10% molar excess) of thiolacetic acid followed by 0.144 g of N,N-dimethylbenzylamine in a 100 mL resin kettle fitted with reflux condenser. The mixture was heated to 80° C. under a nitrogen blanket and stirred for two hours during which time it turned a dark yellow color. The $^1$HNMR spectrum in $CDCl_3$ indicated complete consumption of the epoxy groups as well as the formation of intermediates assignable to thiol/acetate and thiolacetate/acetate products. To the crude reaction mixture were added 30 g ethanol and 15 g con. aq. HCl. The mixture was heated to a mild reflux with stirring for one hour. The reaction mixture was worked up by dissolving the organic phase in methylene chloride (30 mL), washing three times with water, drying over anhydrous magnesium sulfate, filtering and removing the solvent under vacuum at 40–50° C. to afford 21.0 g (87.5%) of the dithiol 2 as a viscous resin which crystallized upon prolonged storage. This resin was characterized by $^1$H and $^{13}$C NMR spectroscopy as well as by infrared spectroscopy. Titration with iodine indicated 4.0 meq/g SH (81.6% of theory).

Example 2

Preparation of Acid Functional Dithiol from the Dithiol of Example 1 Using Succinic Anhydride The dithiol resin of example 1 (2.0 g, 9.8 meq), succinic anhydride (0.49 g, 4.9 meq) and pyridine (~0.014 g) were combined in a 50 mL flask and heated to 80° C. under nitrogen with stirring. After 6.5 hours the volatiles were removed in vacuo to yield a viscous resin which was characterized by $^1$HNMR and $^{13}$CNMR spectroscopy as the mono-acid functional dithiol. Titration with iodine indicated 3.4 meq/g SH (87% of theory).

Example 3

Preparation of Di-acid Functional Dithiol from the Dithiol of Example 1 Using Phthalic Anhydride The dithiol resin of example 1 (3.0 g, 14.7 meq) and phthalic anhydride (2.1 g, 14.7 meq) were dissolved in acetonitrile (3 mL) in a 10 mL single-necked flask equipped with a reflux condenser and magnetic stirring. The solution was heated to light reflux for 8 h. under argon, and then the solvent was removed to afford an amber-colored solid resin which was characterized by $^1$HNMR spectroscopy as the di-acid functional dithiol. Thiol and carboxyl titration data supported this spectral data.

Example 4

Preparation of Polyfunctional β-hydroxy Thiol Resin from Cresol Novolak Epoxy Resin To 25.00 g (approx. 0.125 eq.) of an approximately pentafunctional cresol novolak epoxy resin (EPON® 164 from Shell Chemical Co.) were added 9.52 g (0.125 eq.) of thiolacetic acid followed by 0.173 g (0.5%)of N,N-dimethylbenzylamine in a 100 mL resin kettle fitted with reflux condenser. The mixture was heated to 80° C. under a nitrogen blanket and stirred for two hours during which time it turned a bright yellow color. The $^{13}$CNMR spectrum in CDCl$_3$ indicated the consumption of >95% of the epoxy groups. To the crude reaction mixture were added 34.7 g ethanol and 17.3 g con. aq. HCl. The mixture was heated to a mild reflux with stirring for four hours. The reaction mixture was worked up by dissolving the organic phase in methylene chloride, washing three times with water, drying over anhydrous magnesium sulfate, and filtering. The solvent was removed under vacuum to yield 28.0 g of the polyfunctional thiol resin (quantitative yield) as a pale yellow resinous solid. Residual solvent could be minimized by drying a sample in a vacuum oven at 100° C. for several hours. This resin was characterized by $^1$H and $^{13}$C NMR spectroscopy as well as by infrared spectroscopy. Titration with iodine indicated 3.0 meq/g SH (75–100% of theory based on starting epoxy equivalent weight of 3.6–4.8 meq/g as reported by manufacturer). Other batches provided thiol values as high as 3.3 meq/g.

Example 5

Preparation of Acid Functional Polyfunctional Thiol Resin from the Polyfunctional Thiol Resin of Example 4

It was found to be necessary to wash the thiol resin of example 4 with base prior to derivitizing with succinic anhydride in order for the reaction to proceed smoothly. 31 g of cresol novolak based polyfunctional thiol resin prepared as in example 4 were taken up in 100 mL methylene chloride. A water wash indicated a pH of about 3. The organic layer was then washed with 10% aqueous sodium carbonate. Subsequent water washes indicated a pH of 7–8. The organic layer was dried over anhydrous magnesium sulfate and the solvent removed under vacuum to yield 23 g (74% recovery). A portion of this base-washed material (20.00 g, 0.095 eq.) was taken up in 20 mL acetonitrile and heated to 80 (C. under nitrogen in a 100 mL resin kettle. 0.2 mL pyridine were charged and the solution stirred for 30 min. without any sign of reaction. 3.8 g (0.038 eq) succinic anhydride were charged. After 1.5 hours the viscosity had significantly increased. After 4.5 hours the solvent was removed on a rotary evaporator to yield the acid functional thiol resin as a pale yellow solid. Titration indicated 2.7 meq/g SH and 1.6 meq/g CO$_2$H. This material could be further purified by dissolving in 1% aqueous sodium carbonate and then re-precipitating by adding 10% aqueous hydrochloric acid. After rinsing with water and drying under vacuum the product was a colorless powder.

Example 6

Preparation of Trifunctional β-hydroxy Thiol Resin from Tris(2,3-epoxypropyl) Isocyanurate To a 100 mL resin kettle equipped with mechanical stirrer and reflux condenser were charged 15.02 g (0.153 eq.) tris(2,3-epoxypropyl) isocyanurate (TEPIC-S from Nissan Chemical Industries, Ltd.) and 12.4 g thiolacetic acid (0.16 eq.). The reaction mixture was stirred under nitrogen until a clear solution resulted. 60 ml N,N'-dimethylbenzylamine were added, after which the temperature began to slowly rise due to the exotherm. At a temperature of about 50° C. an ice bath was used to maintain the temperature in the range 45–55° C. until the exotherm subsided (approximately 2–3 hours). The temperature was then increased to 80° C. using an oil bath for 5–6 hours. The $^1$HNMR spectrum in CDCl$_3$ indicated nearly complete consumption of the epoxy groups. To the crude reaction mixture were added 40 mL con. aq. HCl and 50 mL ethanol. The mixture was heated to 70° C. and stirred for 2 hours, resulting in a clear colorless solution. The hydrolyzed reaction mixture was transferred to a 500 mL beaker and diluted with 50 mL H$_2$O. 40% aq. NaOH was added slowly using an ice bath to control the exotherm until a pH of 6–7 was reached; some phase separation was evident at this point. The mixture was then extracted twice with methylene chloride, washed twice with water, and dried over anhydrous magnesium sulfate. Solvent was removed under vacuum at 80° C. for 10 hours to yield 14.0 g (69% yield) of the trifunctional β-hydroxy thiol resin. This resin was characterized by $^1$H and $^{13}$C NMR spectroscopy as well as by infrared spectroscopy. Titration with iodine indicated 6.80 meq/g SH (93% of theory).

Example 7

Preparation of Monoacid Functional Trithiol Functional Resin from the Trithiol Functional Resin of Example 6

The trithiol of example 6 (6.77 g, 0.059 eq), succinic anhydride (1.536 g, 0.0154eq) and pyridine (67 ml) were charged to a 100 mL resin kettle and stirred at 85 (C. under nitrogen for 24 hours. Volatiles were then removed under vacuum at 85 (C. to yield a semisolid resin. Titration indicated 5.24 meq/g SH (87% of theory) and 1.83 meq/g CO$_2$H (92% of theory).

Example 8

Preparation of Triacid Functional Trithiol Functional Resin from the Trithiol Functional Resin of Example 6

A trithiol prepared as described in example 6(16.1 g, 0.121 eq), succinic anhydride (12.0 g, 0.120 eq), pyridine (150 ml) and acetonitrile (50 mL) were charged to a 100 mL resin kettle and stirred at 80° C. under nitrogen for 24 hours. Volatiles were then removed under vacuum to yield a viscous resin. Titration with iodine indicated 2.6 meq/g SH (60% of theory). Titration with base indicated 3.6 meq/g $CO_2H$ (83.7% of theory). A portion of this product could be purified as follows: 4.7 g were completely dissolved in 50 mL 10% aqueous sodium bicarbonate. 15% aqueous hydrochloric acid was added until a pH of 2–3 was reached, causing a precipitate to form. This solid was collected, dissolved in 40 mL acetone, dried over $MgSO_4$, filtered and the solvent removed under vacuum to yield 2.19 g. The thiol value of this product had increased to 3.1 meq/g SH (72% of theory), while the acid value remained at 3.6 meq/g $CO_2H$.

Example 9

Thiol Resin from Chlorohydrin Resin

The following example serves to demonstrate the ability to use chlorohydrin functionality as a starting point for the synthesis of acid functional thiol resins. The chlorohydrin derived from bisphenol A diglycidyl ether (2.0 g, 9.7 meq.) was taken up in 8.0 g acetonitrile. 2.0 g sodium carbonate were added followed by thiolacetic acid (0.74 g, 9.7 meq) and the reaction mixture was stirred and heated to reflux under nitrogen. Upon cooling and removing the solvent, $^1$HNMR spectroscopy revealed a mixture of some residul starting material as well as the same thiol/acetate and thiolacetate/acetate intermediates detected in the synthesis of Example 1 before hydrolysis provided the pure dithiol.

Example 10

Photoimageable Composition

The following materials were co-dissolved to make an approximately 50% solids coating solution:

Acid functional thiol resin of example 5 477 mg
Triallyl isocyanurate (Nippon Kasei) 116 mg
Irgacure® 907 (Ciba) 21 mg
Isopropylthioxanthone 11 mg
Acetone 600 mg A 6"×6" copper laminate board was cleaned in a 20% sodium persulfate/2% sulfuric acid aqueous solution for 2 minutes followed by a thorough rinse with deionized water and drying. The coating solution was then applied using a Meyer rod and dried for 30 minutes in an 80° C. oven to yield a smooth tack free film. This was then exposed to approximately 360 $mJ/cm^2$ UV light through a mylar negative image with 5 mil lines and spaces without vacuum using a Colight 1330C printer with a 5 kW lamp. The image was then readily developed in a spray of 1% aqueous sodium carbonate to reveal the pattern with a high degree of resolution. The surface of the coating corresponding to UV exposed areas remained hard and glossy, showing no signs of oxygen inhibition as is seen with acrylate systems cured in air.

What is claimed is:

1. A photoimageable composition developable in aqueous base comprising a substantially ester-free, acid-functional thiol-functional resin prepared from the reaction of an epoxy compound with a thiolacetic acid in the presence of an amine catalyst and heat which is hydrolyzed to yield an ester-free, β-hydroxy thiol-functional resin and then reacted with a material capable of inserting a group conferring aqueous-base developpaility.

2. The photoimageable composition of claim 1, wherein the thiol-functional resin is a derivative of a phenol or cresol novolak epoxy resin.

3. The photoimageable composition of claim 1, wherein the thiol-functional resin is a derivative of a cyanurate or an isocyanurate epoxy resin.

4. The photoimageable composition of claim 1, wherein the thiol-functional resin is a reaction product of a cyclic anhydride and a β-hydroxy thiol-functional resin.

5. The photoimageable composition of claim 4, wherein the cyclic anhydride is selected from the group consisting of maleic, succinic, trimellitic, phthalic, tetrahydrophthalic and hexahydrophthalic anhydride, whereby the resulting resin has at lease one pendant acid group per molecule.

6. The photoimageable composition of claim 1, wherein the epoxy-functional resin is selected from the group consisting of epoxy-functional cresol novolak resins and tris (epoxypropyl) isocyanurate.

7. The photoimageable composition of claim 1, further comprising a photoinitiator.

8. The photoimageable composition of claim 1, further comprising one or more photosensitizers, inhibitors, pigments, dyes, fillers, stabilizers, solvents, adhesion promoters, thiol- or acid-containing oligomers, epoxy resins, or rheology aids.

* * * * *